(12) United States Patent
Huang

(10) Patent No.: US 8,760,876 B2
(45) Date of Patent: Jun. 24, 2014

(54) USB MEMORY STICK

(75) Inventor: Joseph Huang, Taoyuan (TW)

(73) Assignee: Ho E Screw & Hardware Co., Ltd., Lu-Chu, Taoyuan, (TW)

( * ) Notice: Subject to any disclaimer, the term of this patent is extended or adjusted under 35 U.S.C. 154(b) by 167 days.

(21) Appl. No.: 13/405,268

(22) Filed: Feb. 25, 2012

(65) Prior Publication Data

US 2012/0327610 A1    Dec. 27, 2012

(30) Foreign Application Priority Data

Jun. 22, 2011    (TW) .............................. 100211284 U

(51) Int. Cl.
*H05K 1/14*    (2006.01)
(52) U.S. Cl.
USPC .......................................... 361/737; 361/799
(58) Field of Classification Search
USPC ............... 361/737, 740, 799, 679.31–679.45; 439/131, 140
See application file for complete search history.

(56) References Cited

U.S. PATENT DOCUMENTS

| 7,172,460 B2 * | 2/2007 | Zhao et al. ................ 439/607.56 |
| 7,802,997 B2 * | 9/2010 | Kuo .............................. 439/76.1 |
| 8,116,083 B2 * | 2/2012 | Ni et al. ........................ 361/737 |

FOREIGN PATENT DOCUMENTS

TW    98115626    11/2010

* cited by examiner

*Primary Examiner* — Hung S Bui
(74) *Attorney, Agent, or Firm* — Guice Patents PLLC

(57) ABSTRACT

A USB memory stick includes a metal shell structure defining opposing top opening and bottom opening and a locating hole, a PC board formed of a USB interface circuit and a memory chip package, and a tray, which includes a support panel supporting the PC board, a clip extended from one side of the support panel and clamped on the memory chip package of the PC board, a spring plate extended from the clip and pressed on the PC board against the support panel, and an oblique retaining leaf obliquely extended from the spring plate and engaged into the locating hole of the metal shell structure.

8 Claims, 8 Drawing Sheets

US 8,760,876 B2

USB MEMORY STICK

BACKGROUND OF THE INVENTION

1. Field of the Invention

The present invention relates to memory stick technology and more particularly, to a USB memory stick that is electrically connectable to a computer for data access and facilitates carrying and quick installation.

2. Description of the Related Art

A USB memory stick is a mobile data storage device convenient for carrying and connectable to a computer for data access. Following development of data storage technology, the storage capacity of regular USB memory sticks has been greatly expanded for wide field applications.

A regular USB memory stick generally comprises a metal shell made of a metal sheet member by stamping, a plastic shell surrounding the metal shell, a PC board accommodated in the metal shell and providing a memory IC package for data storage, and an insulative member fastened to the metal shell and stopped against the PC board. This conventional design has the advantages of quick fabrication and low manufacturing cost. However, the use of the plastic shell to surround the metal shell destructs the sense of beauty.

Taiwan Patent Application No. 98115626 discloses a USB memory stick, entitled "USB memory stick with a seamless metal shell". This design of USB memory stick comprises a metal shell formed of a seamless metal rectangular tube, a PC board, a metal tray holding the PC board inside the metal shell, and an insulative holder block located on the top side of the metal tray. This design of USB memory stick causes a sense of beauty. However, the assembly process of this design of USB memory stick is complicated, requiring much time and labor.

SUMMARY OF THE INVENTION

The present invention has been accomplished under the circumstances in view. It is the main object of the present invention to provide a USB memory stick, which facilitates quick and accurate assembly with less time and labor.

To achieve this and other objects of the present invention, a USB memory stick comprises a metal shell structure defining opposing top opening and bottom opening and a locating hole, a PC board formed of a USB interface circuit and a memory chip package, and a tray, which comprises a support panel supporting the PC board, a clip extended from one side of the support panel and clamped on the memory chip package of the PC board, a spring plate extended from the clip and pressed on the PC board against the support panel, and an oblique retaining leaf obliquely extended from the spring plate and engaged into the locating hole of the metal shell structure.

The design of the spring plate prevents displacement of the PC board relative to the tray. The engagement design between the oblique retaining leaf of the tray and the locating hole of the metal shell structure facilitates the assembly process of the USB memory stick. During the assembly process, the PC board is secured to the tray, and then the tray is inserted into the metal shell structure to force the oblique retaining leaf of the tray into the locating hole of the metal shell structure. Thus, the USB memory stick can be assembled rapidly and accurately with less time and labour.

Further, the tray comprises a transverse stop flange located on the bottom side of the support panel remote from the clip for stopping against the bottom edge of the PC board, and two longitudinal ribs bilaterally located on the top side of the support panel to support the PC board on the support panel in a lifted condition, assuring positive contact upon insertion of the USB memory stick into a USB jack and providing excellent heat dissipation.

Further, the spring plate of the tray can be variously embodied subject to the USB3.0, USB2.0 or mini USB2.0 specification of the PC board.

DETAILED DESCRIPTION OF THE PREFERRED EMBODIMENT

Figures 1, 1A:
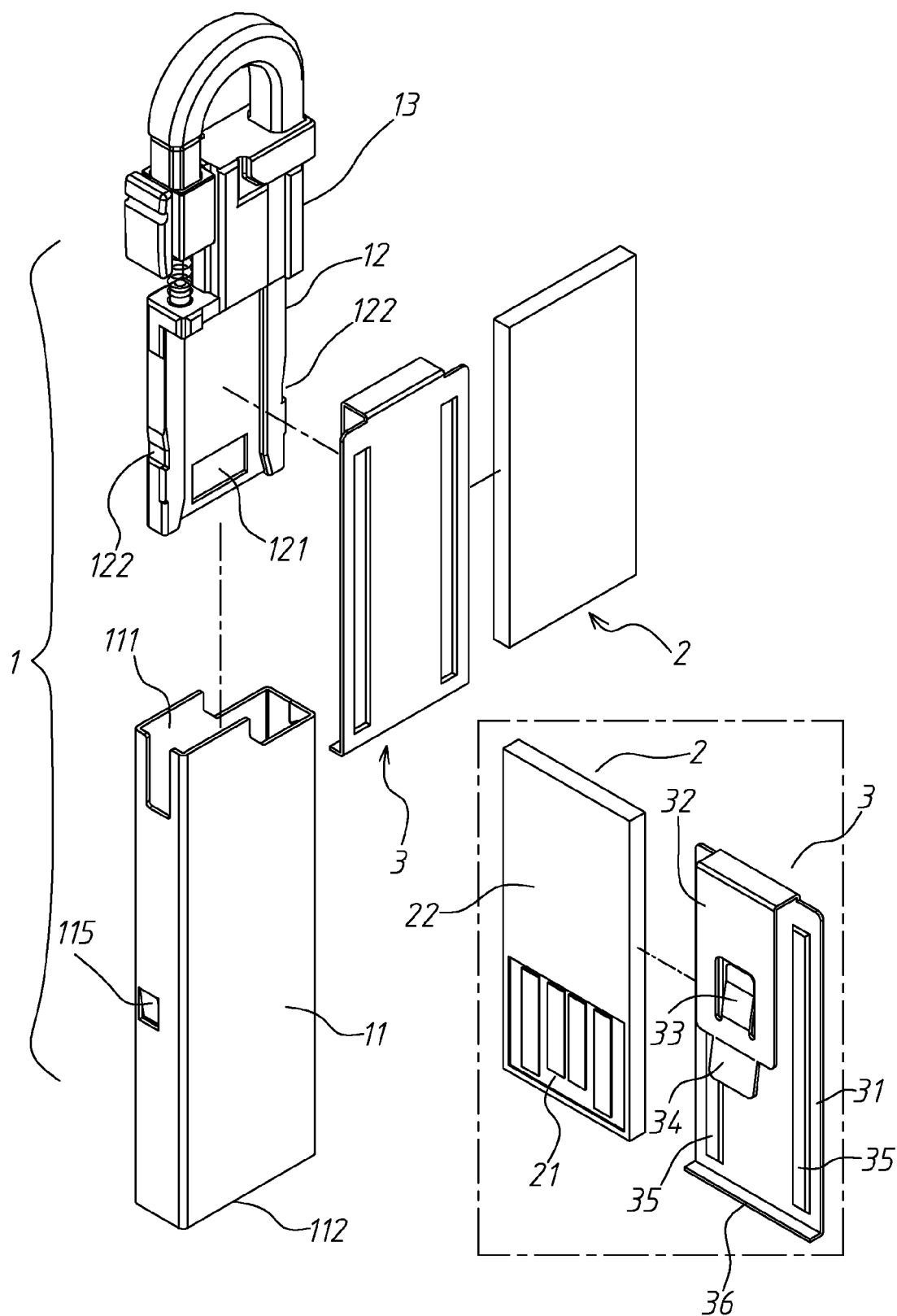
FIG. 1 is an exploded view of a USB memory stick in accordance with a first embodiment of the present invention.
FIG. 1A is an oblique front view of a part of FIG. 1, illustrating the structure of the PC board and the tray.
Figure 2:
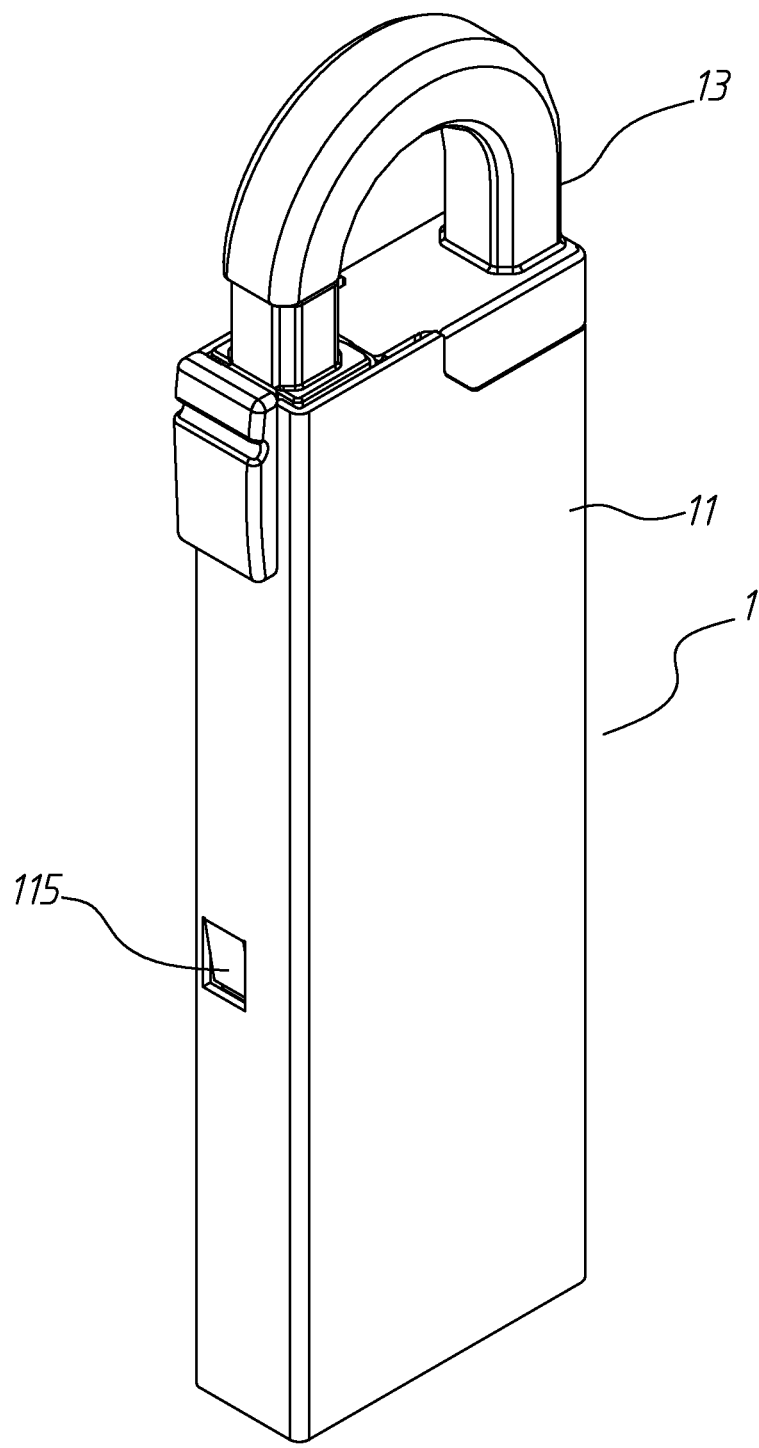
FIG. 2 is an elevational assembly view of the USB memory stick in accordance with the first embodiment of the present invention.

Referring to FIGS. 1 and 2, a USB memory stick in accordance with a first embodiment of the present invention is shown. The USB memory stick comprises a metal shell structure 1, a PC board 2, and a tray 3.

Figures 3, 4:
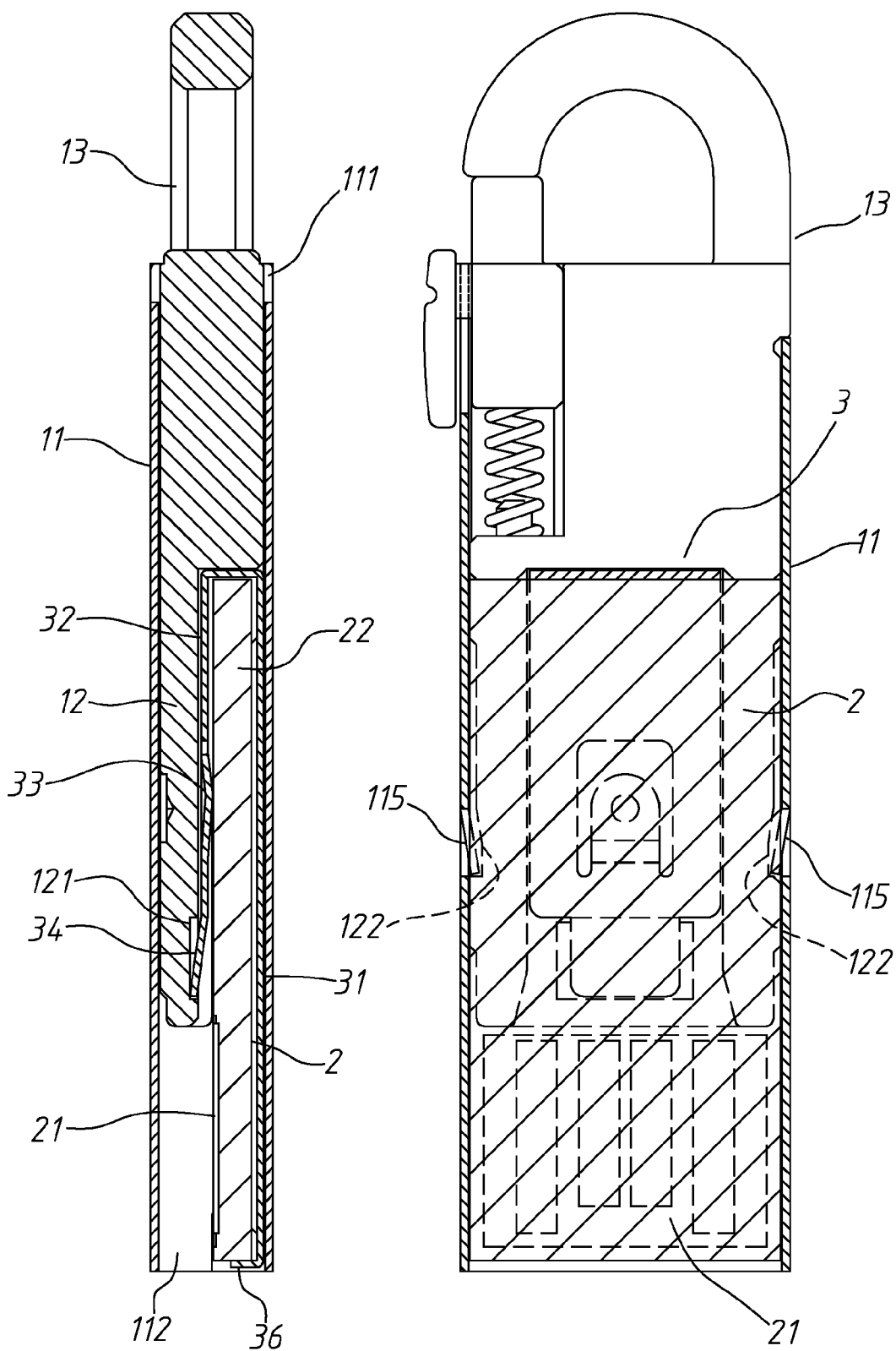
FIG. 3 is a schematic sectional plain view of the USB memory stick in accordance with the first embodiment of the present invention.
FIG. 4 is a schematic sectional side view of the USB memory stick in accordance with the first embodiment of the present invention.
Figure 5:
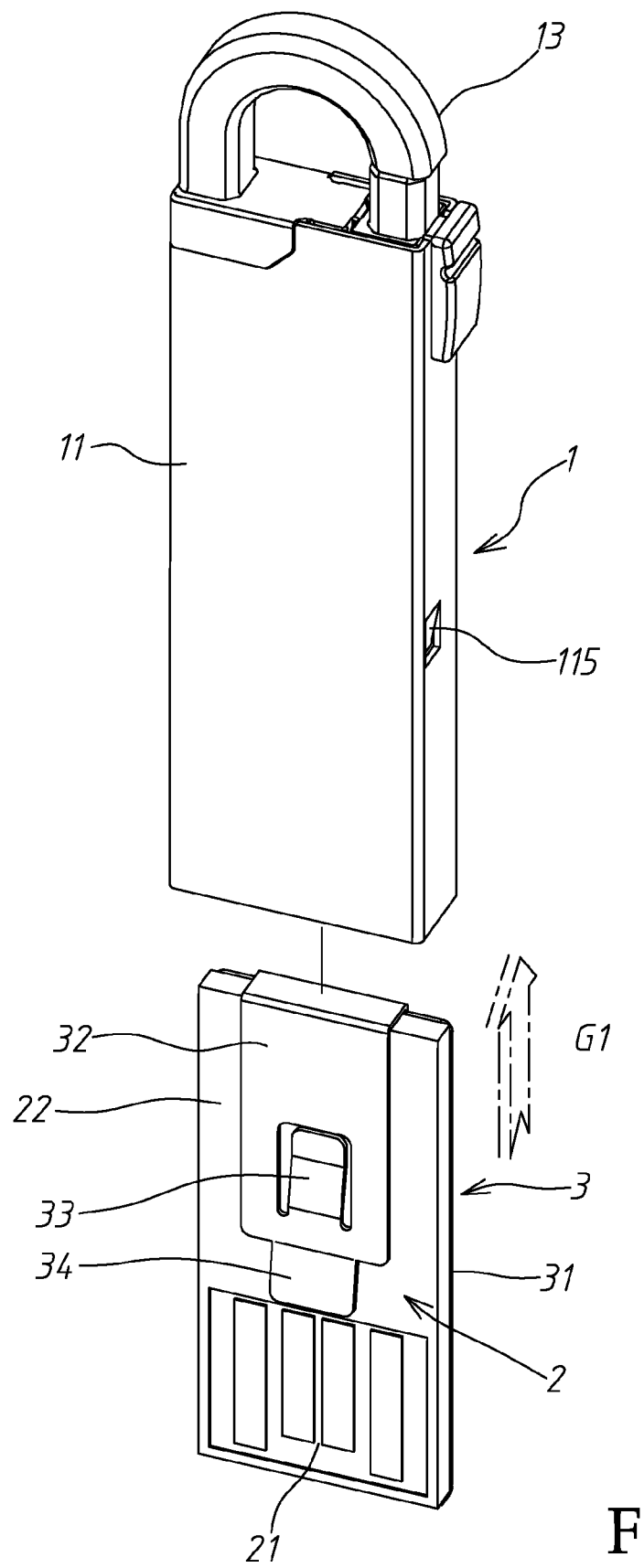
FIG. 5 is a schematic drawing illustrating an assembly step of the USB memory stick in accordance with the first embodiment of the present invention.

The metal shell structure 1 comprises a metal casing 11, a lock holder 12, and a padlock 13. The metal casing 11 comprises opposing top opening 111 and bottom opening 112, and two retaining lugs 115 respectively inwardly extended from two opposite lateral sidewalls thereof. The lock holder 12 comprises a locating hole 121 cut through opposing front and back sides thereof, and two retaining grooves 122 respectively and symmetrically located on two opposite lateral sidewalls thereof. The lock holder 12 is inserted into the metal casing 11 to force the two retaining grooves 122 into engagement with the retaining lugs 115 of the metal casing 11, as shown in FIG. 3, and thus, the lock holder 12 is firmly secured to the inside of the metal casing 11.

The PC board 2 comprises a USB interface circuit 21 and a memory chip package 22, as shown in FIG. 1A.

The tray 3 is made of a metal sheet material by stamping, comprising a support panel 31 for supporting the whole bottom surface of the PC board 2, a clip 32 extended from one side, for example, the top side of the support panel 31 for clamping on the top surface of the memory chip package 22 of the PC board 2, a spring plate 33 extended from the clip 32 for holding down the PC board 2 on the support panel 31 to stop the PC board 2 from displacement relative to the tray 3, and an oblique retaining leaf 34 obliquely extended from the spring plate 33 for engaging into the locating hole 121 of the lock holder 12 to lock the lock holder 12 in position. Further, two longitudinal ribs 35 are bilaterally located on the top side of the support panel 31 to support the PC board 2 on the support panel 31 in a lifted condition, assuring positive contact upon insertion of the USB memory stick into a USB jack and providing excellent heat dissipation. Further, a transverse stop flange 36 is located on the bottom side of the support panel 31 remote from the clip 32 for stopping against the bottom edge of the PC board 2, as shown in FIG. 4, to keep the USB interface circuit 21 in the bottom opening 112 of the metal casing 11 and to prevent falling of the PC board 2 out of the metal casing 11.

Figure 6:
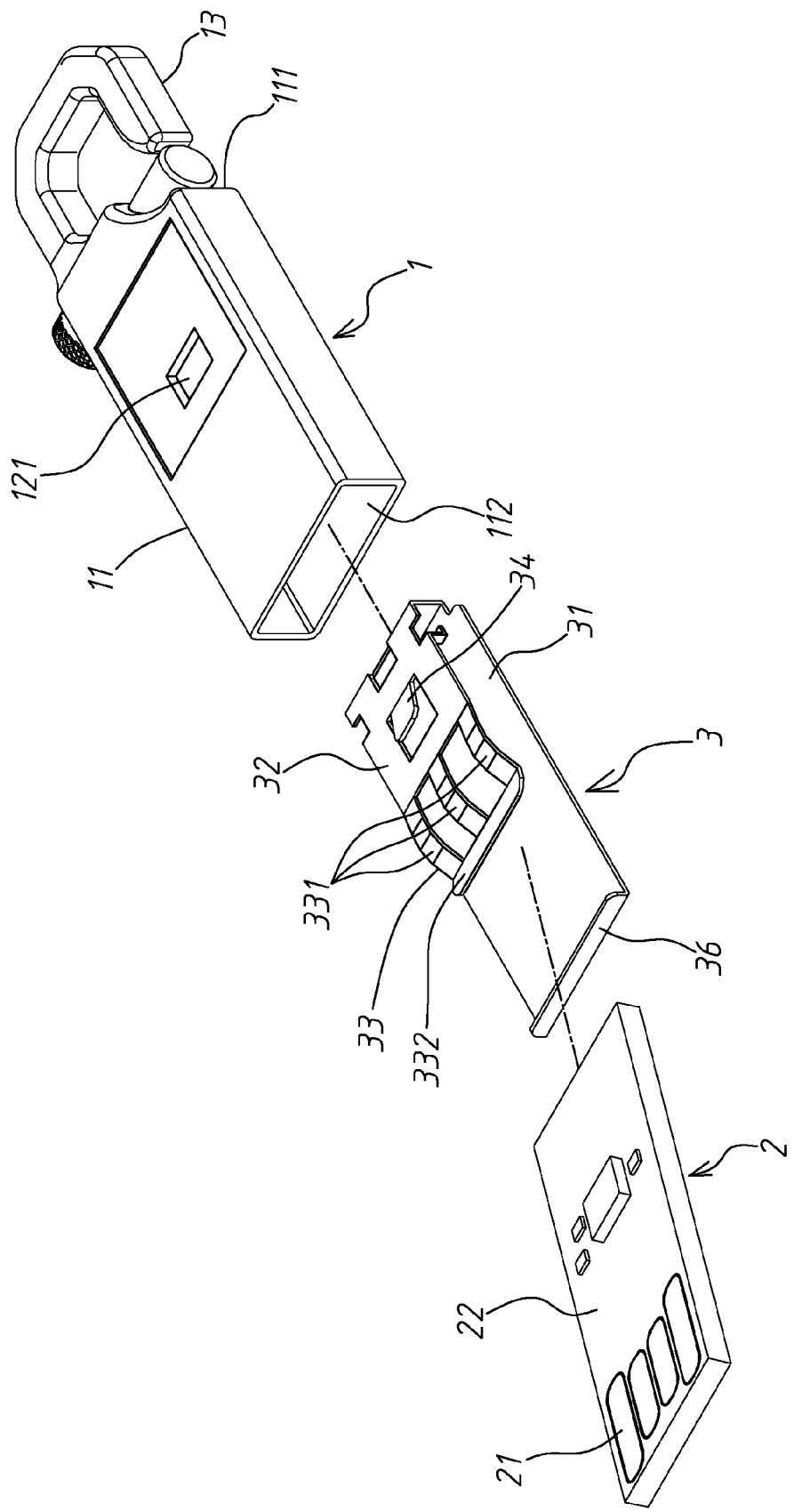
FIG. 6 is an exploded view of a USB memory stick in accordance with a second embodiment of the present invention.
Figure 7:
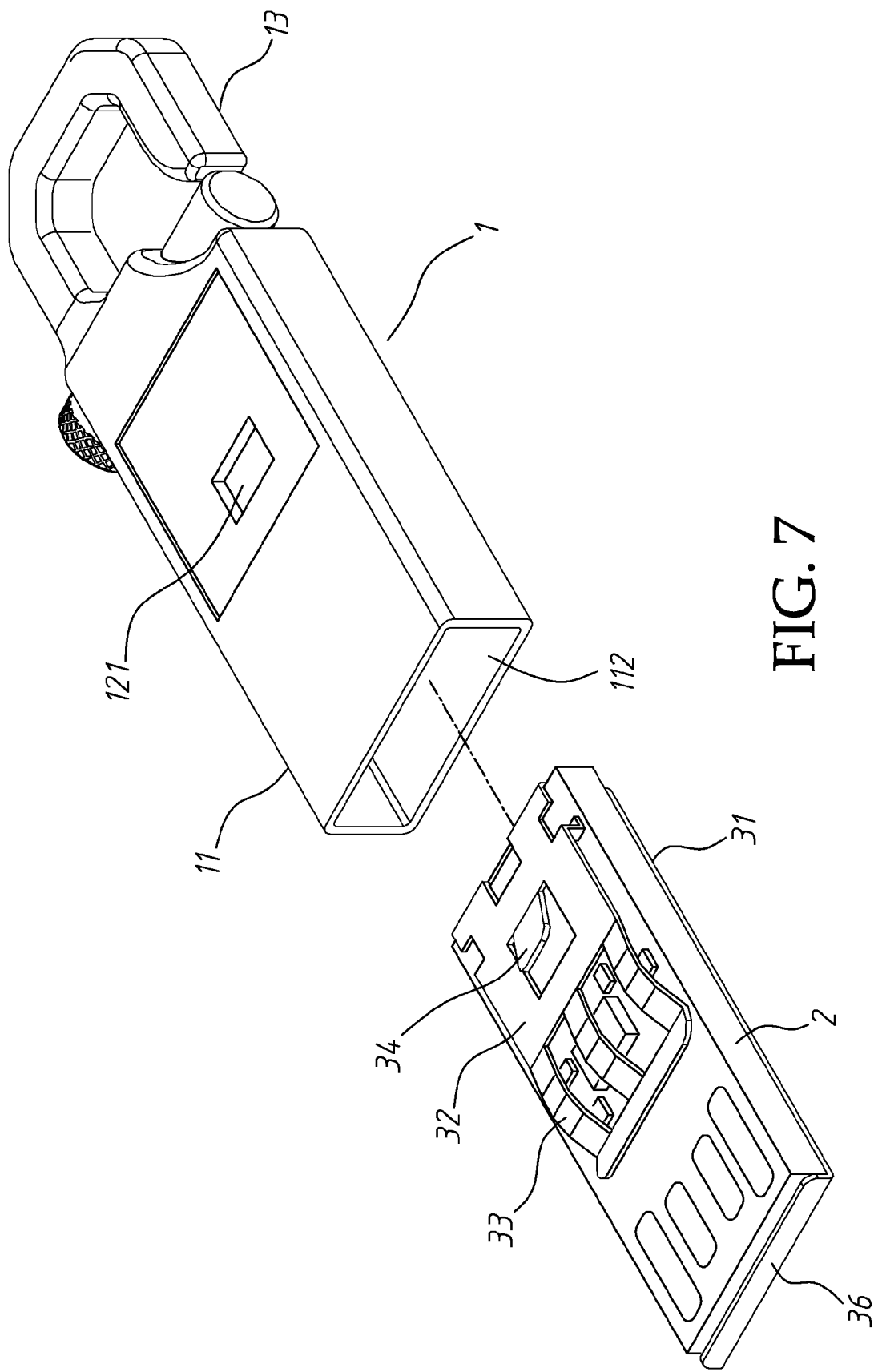
FIG. 7 illustrates an assembly status of the USB memory stick in accordance with the second embodiment of the present invention.

FIGS. 6 and 7 illustrate a USB memory stick in accordance with a second embodiment of the present invention. This second embodiment is substantially similar to the aforesaid first embodiment with the exception that the PC board 2 is configured subject to USB3.0 specification; the spring plate 33 comprises a transverse impression component 332, and three double-bevel arms 331 longitudinally extended from the clip 32 in a parallel manner and terminating in the transverse impression component 332; the oblique retaining leaf 34 is extended from a middle part of the clip 32. The design of the transverse impression component 332 and double-bevel arms 331 of the spring plate 33 avoids contact between the spring plate 33 and the electronic components on the PC board 2; the metal shell structure 1 simply comprises a metal casing 11 and a padlock 13 without the aforesaid lock holder 12. Further, the locating hole 121 according to this second embodiment is directly made on the metal casing 11.

Figure 8:
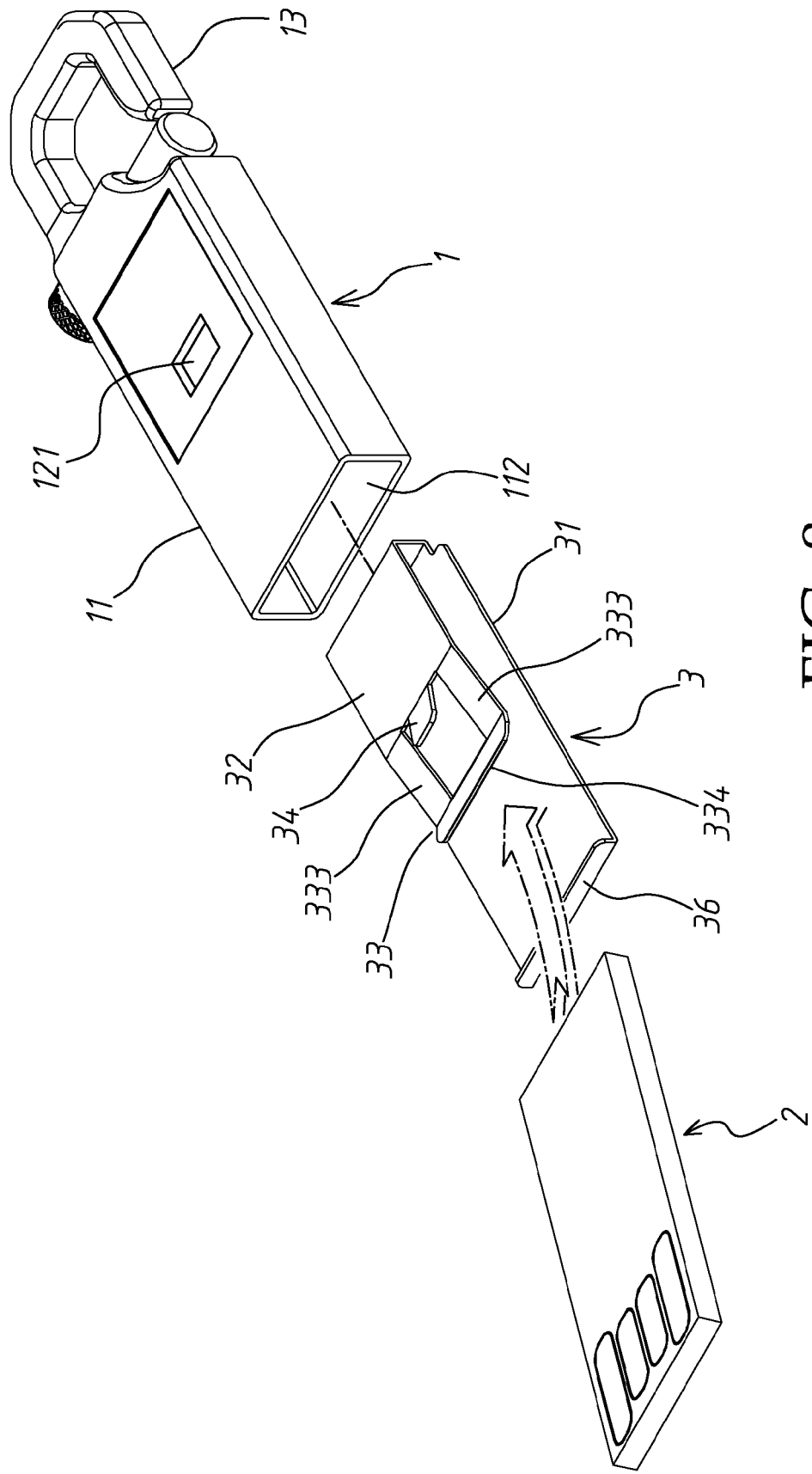
FIG. 8 is an exploded view of a USB memory stick in accordance with a third embodiment of the present invention.

FIG. 8 illustrates a USB memory stick in accordance with a third embodiment. This third embodiment is substantially similar to the aforesaid second embodiment with the exception that the PC board 2 is configured subject to USB2.0 specification; the spring plate 33 comprises a transverse impression component 334, and two oblique arms 333 obliquely upwardly extended from the clip 32 in a parallel manner and terminating in the transverse impression component 334; the oblique retaining leaf 34 is extended from the distal end of the clip 32.

Figure 9:
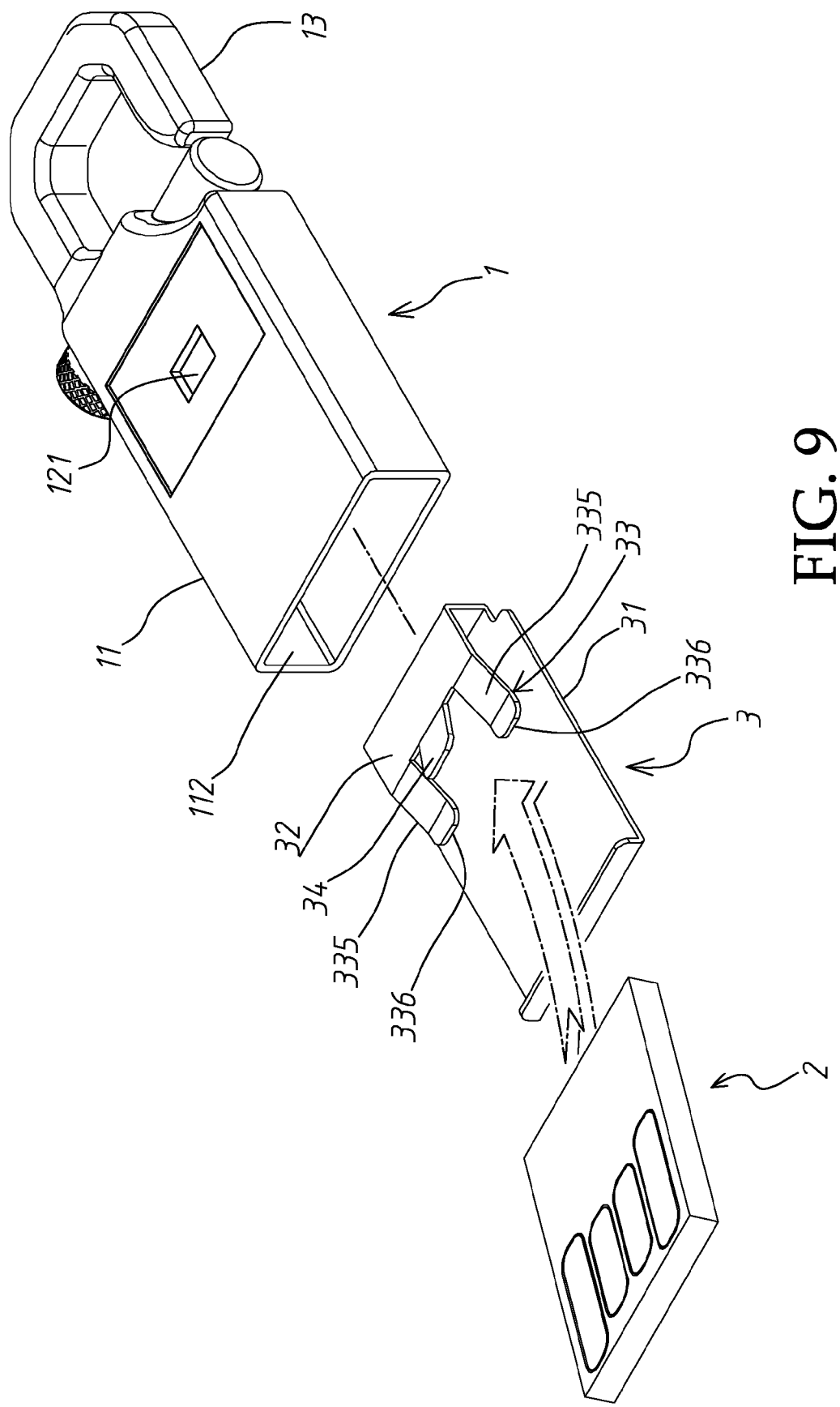
FIG. 9 is an exploded view of a USB memory stick in accordance with a fourth embodiment of the present invention.

FIG. 9 illustrates a USB memory stick in accordance with a fourth embodiment. This fourth embodiment is substantially similar to the aforesaid third embodiment with the exception that the PC board 2 is configured subject to mini USB2.0 specification; the spring plate 33 comprises two oblique arms 335 obliquely downwardly extended from the clip 32 in a parallel manner and two impression components 336 respectively extended from the respective distal ends of the oblique arms 335.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A USB memory stick, comprising:
a metal shell structure comprising opposing top opening and bottom opening and a locating hole;
a PC board comprising at least one USB interface circuit and a memory chip package; and
a tray comprising a support panel for supporting said PC board, a clip extended from one side of said support panel for clamping on said memory chip package of said PC board, a spring plate extended from said clip for holding down said PC board on said support panel, and an oblique retaining leaf obliquely extended from said spring plate for engaging into said locating hole of said metal shell structure;
wherein said spring plate comprises a transverse impression component, and two oblique arms obliquely upwardly extended from said clip in a parallel manner and terminating in said transverse impression component; said oblique retaining leaf is extended from a distal end of said clip remote from said support panel.

2. The USB memory stick as claimed in claim 1, wherein said tray further comprises a transverse stop flange located on a bottom side of said support panel remote from said clip for stopping against a bottom edge of said PC board.

3. The USB memory stick as claimed in claim 1, wherein said tray further comprises two longitudinal ribs bilaterally located on a top side of said support panel for supporting said PC board on said support panel in a lifted condition.

4. The USB memory stick as claimed in claim 1, wherein said metal shell structure comprises a metal casing, a lock holder mounted in said metal casing, and a lock mounted at said lock holder; said top opening and said bottom opening of said metal shell structure are respectively located on opposing top and bottom sides of said metal casing; said locating hole of said metal shell structure is located on said lock holder.

5. The USB memory stick as claimed in claim 4, wherein said lock holder comprises two retaining grooves respectively and symmetrically located on two opposite lateral sidewalls thereof; said metal casing comprises two retaining lugs respectively extended from two opposite lateral sidewalls thereof and respectively engaged into said retaining grooves of said lock holder.

6. The USB memory stick as claimed in claim 1, wherein said spring plate comprises a transverse impression component, and three double-bevel arms longitudinally extended from said clip in a parallel manner and terminating in said transverse impression component; said oblique retaining leaf is extended from a middle part of said clip.

7. The USB memory stick as claimed in claim 6, wherein said metal shell structure comprises a metal casing, and a lock mounted at a top side of said metal casing.

8. The USB memory stick as claimed in claim 1, wherein said spring plate comprises two oblique arms obliquely downwardly extended from said clip in a parallel manner, and two impression components respectively extended from respective distal ends of said oblique arms remote said clip.

* * * * *